(12) United States Patent
Liu et al.

(10) Patent No.: US 11,195,939 B2
(45) Date of Patent: Dec. 7, 2021

(54) COMMON-EMITTER AND COMMON-BASE HETEROJUNCTION BIPOLAR TRANSISTOR

(71) Applicant: Waython Intelligent Technologies Suzhou Co., Ltd, Jiangsu (CN)

(72) Inventors: Honggang Liu, Jiangsu (CN); Zhipeng Yuan, Jiangsu (CN)

(73) Assignee: WAYTHON INTELLIGENT TECHNOLOGIES SUZHOU CO., LTD, Suzhou (CN)

( * ) Notice: Subject to any disclaimer, the term of this patent is extended or adjusted under 35 U.S.C. 154(b) by 72 days.

(21) Appl. No.: 16/627,385

(22) PCT Filed: Mar. 4, 2019

(86) PCT No.: PCT/CN2019/076793
§ 371 (c)(1),
(2) Date: Dec. 30, 2019

(87) PCT Pub. No.: WO2019/170045
PCT Pub. Date: Sep. 12, 2019

(65) Prior Publication Data
US 2020/0219994 A1  Jul. 9, 2020

(30) Foreign Application Priority Data
Mar. 9, 2018  (CN) .......................... 201810213533.6

(51) Int. Cl.
*H01L 29/737* (2006.01)
*H01L 23/367* (2006.01)
(Continued)

(52) U.S. Cl.
CPC .......... *H01L 29/737* (2013.01); *H01L 23/367* (2013.01); *H01L 29/0817* (2013.01); *H01L 29/0821* (2013.01); *H01L 29/41708* (2013.01)

(58) Field of Classification Search
CPC . H01L 29/737; H01L 23/367; H01L 29/0817; H01L 29/0821; H01L 29/41708;
(Continued)

(56) References Cited

U.S. PATENT DOCUMENTS 5,066,926 A    11/1991  Ramachandran et al.
5,734,193 A *   3/1998  Bayraktaroglu .... H01L 21/8252
                                                    257/197
(Continued)

FOREIGN PATENT DOCUMENTS

CN   103022332 A   4/2013
CN   108598158 A   9/2018

OTHER PUBLICATIONS

Silver et al., High-Volume Manufacturing of InGaP/GaAs HBT Wafers, 2002, GaAsMANTECH, Inc. Conference (Year: 2002).*
(Continued)

*Primary Examiner* — Syed I Gheyas
(74) *Attorney, Agent, or Firm* — Schmeiser, Olsen & Watts, LLP

(57) ABSTRACT

Provided is a common-emitter and common-base heterojunction bipolar transistor disposed on a packaging substrate with a heat sink, including a common-base heterojunction bipolar transistor having a first base, a first emitter and a first collector, a common-emitter heterojunction bipolar transistor having a second base, a second emitter and a second collector, a heat shunt bridge for connecting the first emitter with the second collector, a first pad for being connected with the first base and a first copper pillar, a second pad for being connected with the first collector and a second copper pillar, a third pad for being connected with the second base and a third copper pillar, and a fourth copper pillar disposed above the second emitter; the common-emitter and common-base heterojunction bipolar transistor is flip-chip
(Continued)

mounted on the packaging substrate, and the fourth copper pillar is soldered on the heat sink.

5 Claims, 3 Drawing Sheets

(51) Int. Cl.
*H01L 29/08* (2006.01)
*H01L 29/417* (2006.01)

(58) Field of Classification Search
CPC ............. H01L 2224/18; H01L 21/8252; H01L 27/0605; H01L 29/0804; H01L 29/42304; H01L 29/7371; H01L 29/205; H01L 27/0641; H01L 23/3677; H01L 23/482; H01L 29/0696
See application file for complete search history.

(56) References Cited

U.S. PATENT DOCUMENTS

| | | | |
|---|---|---|---|
| 8,230,133 B2 | 7/2012 | Usui | |
| 2003/0080349 A1 | 5/2003 | Quaglietta et al. | |
| 2004/0124434 A1 | 7/2004 | D'Evelyn et al. | |
| 2006/0072296 A1 | 4/2006 | Mays | |
| 2014/0312390 A1* | 10/2014 | Tsai | H01L 24/14 257/197 |
| 2017/0117857 A1* | 4/2017 | McPartlin | H01L 21/4853 |

OTHER PUBLICATIONS

International Search Report dated Apr. 18, 2019 for PCT/CN2019/076793.
Office Action in related Chinese Patent Application No. 201810213533.6 dated Mar. 21, 2019. 7 pages.

* cited by examiner

COMMON-EMITTER AND COMMON-BASE HETEROJUNCTION BIPOLAR TRANSISTOR

CROSS-REFERENCE TO RELATED APPLICATIONS

This application claims priority to PCT Application No. PCT/CN2019/076793, having a filing date of Mar. 4, 2019, which is based on Chinese Application No. 201810213533.6, having a filing date of Mar. 9, 2018, the entire contents both of which are hereby incorporated by reference.

FIELD OF TECHNOLOGY

The following relates to the semiconductor device technical field, in particular to a common-emitter and common-base heterojunction bipolar transistor.

BACKGROUND

Heterojunction Bipolar Transistor (HBT) has the advantages of high frequency, high efficiency, high linearity, high power density, and single-supply operation, and the like, and is widely used in wireless communications, satellite, radar, electronic warfare and other fields. In order to improve the radio frequency output power of the heterojunction bipolar transistor, the power transistor generally adopts a multi-cell parallel structure, and there is a strong thermoelectric coupling effect between the cells of the bipolar transistor, thereby causing the junction temperature of the intermediate cell to be far higher than that of the edge cells, if the thermoelectric coupling effect between the cells cannot be effectively suppressed, it will eventually cause the heterojunction bipolar transistor to burn out. In conventional art, there are generally two ways to suppress the thermoelectric coupling effect of a heterojunction bipolar transistor: one is to use an emitter or a base ballast resistor to increase the temperature stability of the current gain, but at the expense of the radio frequency power efficiency of the transistor; second, the thermal resistance of the transistor is reduced by thinning the substrate and the back through-hole, however, the complicated backside process poses a great challenge to the manufacturing yield of the conventional gallium arsenide and indium phosphide heterojunction bipolar transistor.

SUMMARY

An aspect relates to a common-emitter and common-base heterojunction bipolar transistor having a high temperature stability and an excellent heat dissipation effect.

Another aspect relates to a common-emitter and common-base heterojunction bipolar transistor is disposed on a packaging substrate, the packaging substrate is provided with a heat sink, and the common-emitter and common-base heterojunction bipolar transistor comprises at least one common-emitter and common-base heterojunction bipolar transistor unit, and the common-emitter and common-base heterojunction bipolar transistor unit comprises a common-base heterojunction bipolar transistor and a common-emitter heterojunction bipolar transistor; the common-base heterojunction bipolar transistor comprises a first base, a first emitter and a first collector; the common-emitter heterojunction bipolar transistor comprises a second base, a second emitter and a second collector; the common-emitter and common-base heterojunction bipolar transistor unit further comprises: a heat shunt bridge for connecting the first emitter and the second collector; a first pad for being connected with the first base, and a first copper pillar disposed over the first pad; a second pad for being connected with the first collector, and a second copper pillar disposed over the second pad; a third pad for being connected with the second base, and a third copper pillar disposed over the third pad; a fourth copper pillar disposed above the second emitter; the common-emitter and common-base heterojunction bipolar transistor unit is flip-chip mounted on the packaging substrate, and the fourth copper pillar is soldered on the heat sink.

The heat shunt bridge is made of one or more of high thermal conductive materials of copper, gold, and aluminum.

A thickness of the heat shunt bridge is 0.5-20 microns.

The common-emitter and common-base heterojunction bipolar transistor unit further comprises a copper-gold-tin alloy solder disposed on the top of the first copper pillar, the second copper pillar, the third copper pillar and the fourth copper pillar, respectively.

The first copper pillar, the second copper pillar, the third copper pillar and the fourth copper pillar are distributed in equal height, and the heat sink comprises a first heat sink layer, a second heat sink layer, a third heat sink layer and a fourth sink layer spaced apart from one another, and when the common-emitter and common-base heterojunction bipolar transistor unit is flip-chip mounted on the packaging substrate, the first copper pillar, the second copper pillar, the third copper pillar and the fourth copper pillar are soldered one-to-one correspondingly on the first heat sink layer, the second heat sink layer, the third heat sink layer and the fourth sink layer.

When the common-emitter and common-base heterojunction bipolar transistor comprises two or more common-emitter and common-base heterojunction bipolar transistor units, the two or more common-emitter and common-base heterojunction bipolar transistor units are connected in parallel.

In the common-emitter and common-base heterojunction bipolar transistor unit, a material system comprises InGaP/GaAs, InGaP/GaAsSb, InGaP/InGaAsSb, InP/InGaAs, InP/GaAsSb or InP/InGaAsSb.

Due to the use of the above technical solutions, the present disclosure has the following advantages over conventional art: by combining the high power gain and high linearity common-emitter and common-base topology and a low thermal resistance copper pillar flip-chip structure, a common-emitter and common-base heterojunction bipolar transistor of the present disclosure overcomes limitations of the traditional heterojunction bipolar transistor on efficiency and thermal stability, and realizes a heterojunction bipolar transistor with high gain, high linearity and high temperature stability, and has a wide application prospect in the field of RF power amplifier technology.

BRIEF DESCRIPTION

Some of the embodiments will be described in detail, with references to the following Figures, wherein like designations denote like members, wherein.

Figure 5:
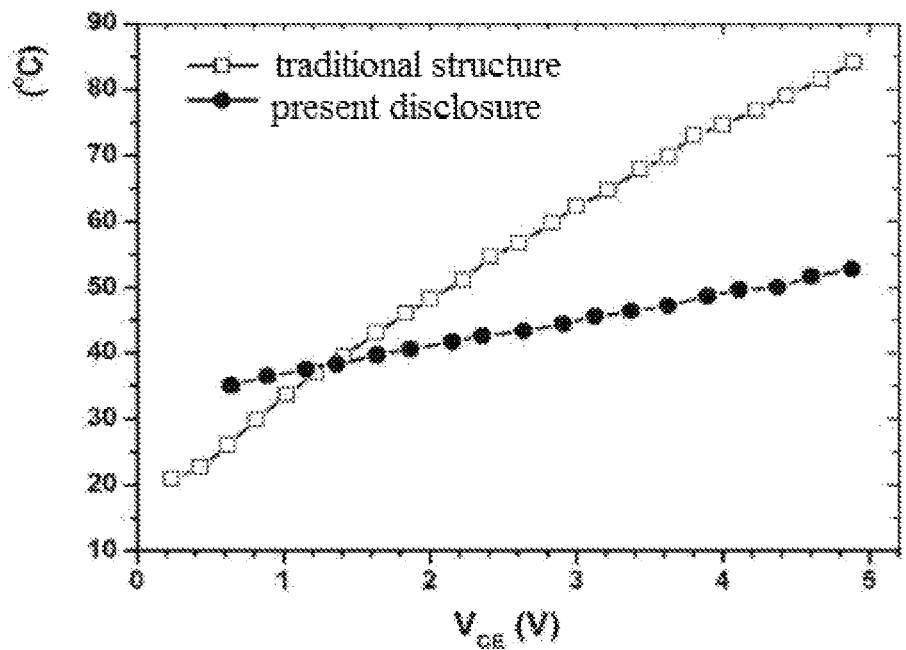
Figure 6:
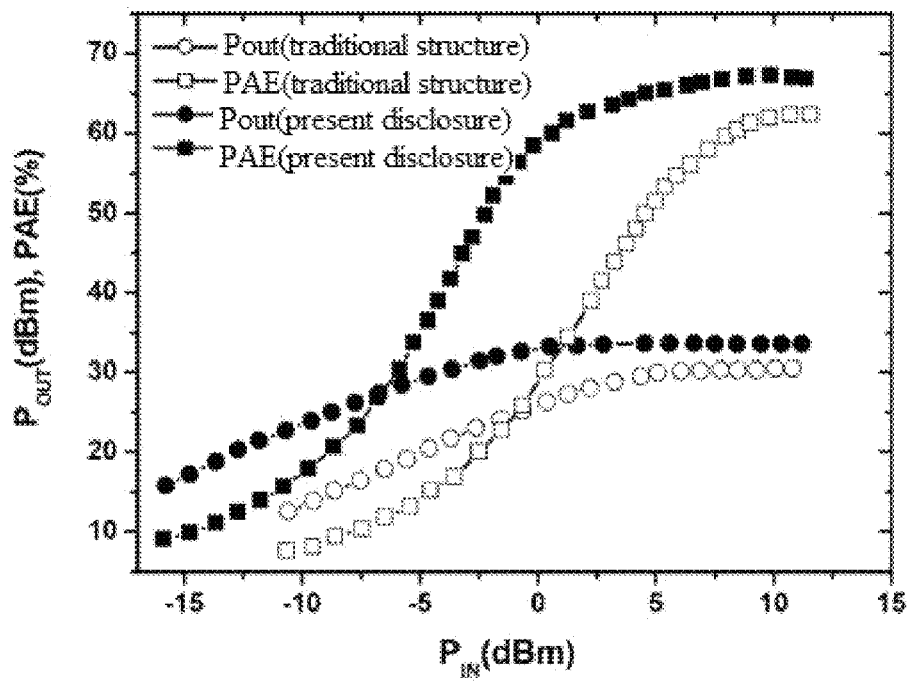

FIG. 5 is the changes of the actual emitter junction temperatures of the common-emitter and common-base heterojunction bipolar transistor provided by an embodiment of the present disclosure and the heterojunction bipolar transistor of the conventional structure over the collector-emitter voltage ($V_{CE}$); and FIG. 6 is the changes of the RF output powers ($P_{OUT}$) and the power added efficiencies (PAE) of the common-emitter and common-base heterojunction bipolar transistor provided by an embodiment of the present disclosure and the heterojunction bipolar transistor of the conventional structure over the radio frequency input power ($P_{IN}$).

DETAILED DESCRIPTION

Figure 1:
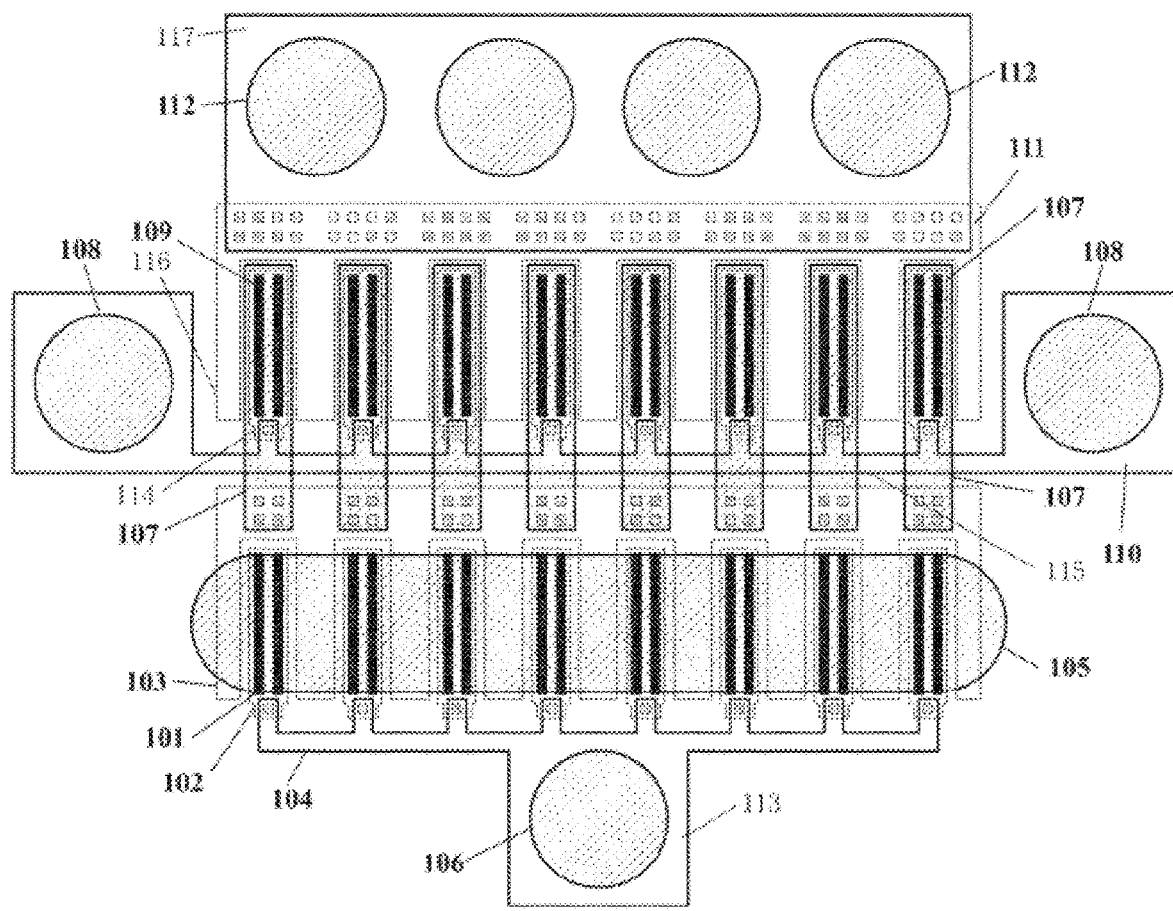
FIG. 1 is a schematic plane structure diagram of a common-emitter and common-base heterojunction bipolar transistor provided by an embodiment of the present disclosure.

FIG. 1 is a schematic plane structure diagram of an embodiment of a common-emitter and common-base heterojunction bipolar transistor provided by the present disclosure. A common-base heterojunction bipolar transistor is at the upper half of the figure, and a common-emitter heterojunction bipolar transistor is at the lower half of the figure. Second collectors 103 are connected with first emitters 109 via heat shunt bridges 107 to form a common-emitter and common-base heterojunction bipolar transistor.

In FIG. 1, the common-emitter heterojunction bipolar transistor comprises eight groups of common-emitter heterojunction bipolar transistor units, and each group of common-emitter heterojunction bipolar transistor unit comprises two second emitters 101. The second emitters 101 of the eight groups are connected with a fourth copper pillar 105. Second bases 102 surrounding the second emitters 101 are connected in parallel to a third pad 113 through a second base lead 104, and a third copper pillar 106 is disposed on the third pad 113.

In FIG. 1, the area and arrangement of the first emitters 109 is identical to the area and arrangement of the second emitters 101. The first emitters 109 are connected with the second collector 103 via the heat shunt bridges 107. The heat shunt bridges 107 are made of a high heat conductive metal, and can make the temperature of the common-base heterojunction bipolar transistor to distribute more evenly. In the present disclosure, the high heat conductive metal comprises, but not limited to, copper, gold, and aluminum. The thickness of the high heat conductive metal is generally greater than the skin depth of the radio frequency transmission line, and in the present embodiment, the thickness of the high heat conductive metal is 0.5-20 microns.

In FIG. 1, first bases 114 are connected in parallel to first pads 110 on both sides through first base leads 115, and first copper pillars 108 are disposed on the first pads 110. First collectors 116 are connected in parallel to a second pad 117 above through first collector leads 111, and a second copper pillar 112 is disposed on the second pad 117.

Figure 2:
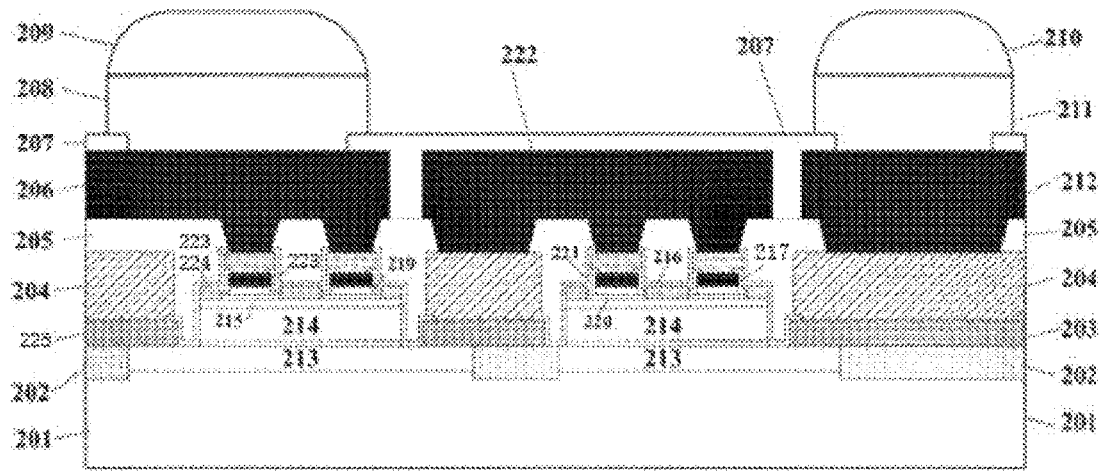
FIG. 2 is a schematic cross-section structure diagram of the common-emitter and common-base heterojunction bipolar transistor provided by an embodiment of the present disclosure.

FIG. 2 is a schematic cross-section structure diagram of an embodiment of a common-emitter and common-base heterojunction bipolar transistor provided by the present disclosure. This embodiment will be specifically described by taking an InGaP/GaAs HBT as an example. In this embodiment, the InGaP/GaAs HBT comprises a first emitter metal 217, a second emitter metal 223, a GaAs emitter region 219, an InGaP emitter region 220, a heavily doped P-type GaAs base region 215, a first base metal 216, a second base metal 224, a lightly doped N-type GaAs collector region 214, a heavily doped N-type GaAs collector region 213, a first collector metal 203, a second collector metal 225, a B implant isolation region 202, and a GaAs semi-insulating substrate 201. The primary wiring metal 204 is positioned over the first collector metal 203 and the second collector metal 225 at a level that is flush with the first emitter metal 217 and the second emitter metal 223. Polyimide dielectric layers or benzocyclobutene (BCB) dielectric layers 205 over the metal electrodes are formed by a spin coating process, and the gaps between the metal electrodes are filled to make the chip surface flattened. A secondary wiring metal is formed by an electroplating gold process to a thickness of 5-10 microns, and a second emitter lead electrode 206, a first collector lead electrode 212, and a heat shunt bridge 222 are formed, respectively. A polyimide secondary flattened dielectric layer 207 and a passivation layer SiN are formed on the secondary wiring metal, and a fourth copper pillar 208 is formed on the second emitter lead electrode 206, and the second copper pillar 211 is formed on the first collector lead electrode 212. A fourth copper-gold-tin alloy solder 209 is disposed on the top of the fourth copper pillar 208, and a second copper-gold-tin alloy solder 210 is disposed on the top of the second copper pillar 211. The fourth copper pillar 208 is equal to the second copper pillar 211 in height, and such a copper pillar structure is favorable for improving the yield of the flip chip process.

Figure 3:
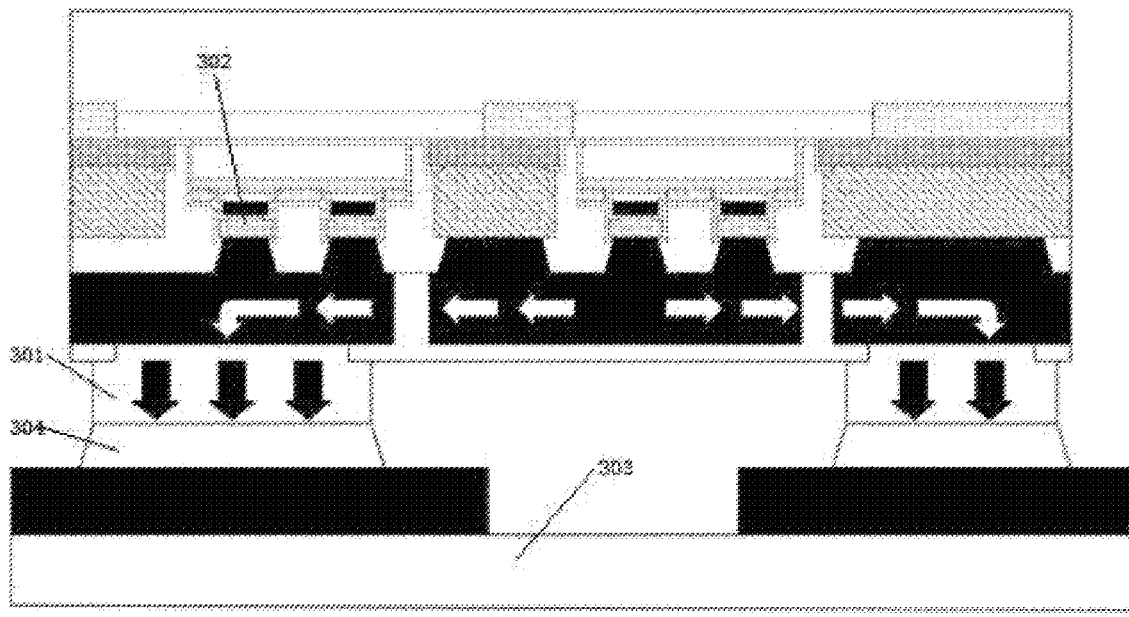
FIG. 3 is a schematic diagram of the flip-chip structure of the common-emitter and common-base heterojunction bipolar transistor provided by an embodiment of the present disclosure.

FIG. 3 is a schematic flip-chip structure diagram of an embodiment of a common-emitter and common-base heterojunction bipolar transistor provided by the present disclosure. The emitter heat-dissipating copper pillar 301 has a height of about 50 microns and is connected to the emitter metal 302 of the common-emitter heterojunction bipolar transistor, and by flip-chip mounting, the heat generated inside the common-emitter and common-base heterojunction bipolar transistor is directly introduced into the heat sink 304 of the packaging substrate 303 through the emitter heat-dissipating copper pillar 301.

Figure 4:
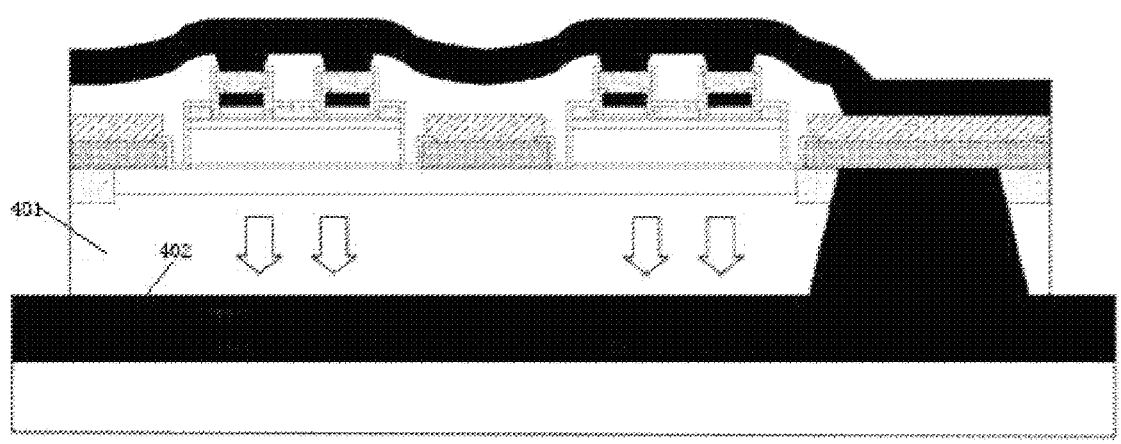
FIG. 4 is a schematic diagram of a junction-up structure and heat dissipation of the traditional heterojunction bipolar transistor.

FIG. 4 is a schematic diagram of the junction-up structure and heat dissipation of a traditional heterojunction bipolar transistor, the heat generated by the heterojunction bipolar transistor passes through a high thermal resistance GaAs substrate 401 (the thickness is usually 100 microns, and the thermal resistivity is 10 times of metallic copper) and diffuses to the heat sink 402 on the back side, and by reducing the thickness of the GaAs substrate to 50 microns or less can improve the heat dissipation effect of the heterojunction bipolar transistor, but causes a large increase in the fragment rate of the back side process. Compared with the traditional structure of InGaP/GaAs HBT, the common-emitter and common-base heterojunction bipolar transistor structure having a heat-dissipating copper pillar provided by the embodiment of the present disclosure can greatly improve the heat dissipation effect of the transistor, effectively suppress the thermoelectrical coupling effect of the common-emitter and common-base heterojunction bipolar transistor caused by the temperature rise, and prevents the common-emitter and common-base heterojunction bipolar transistor from burning during high power operation.

FIG. 5 is the changes of the actual emitter junction temperatures of the common-emitter and common-base heterojunction bipolar transistor of an embodiment provided by the present disclosure and a heterojunction bipolar transistor of the traditional structure over the collector-emitter voltage ($V_{CE}$). When the collector-emitter voltage ($V_{CE}$) increases from 1 V to 5 V, the actual junction temperature of the common-emitter InGaP/GaAs HBT of the traditional structure rises from 31° C. to 85° C., while the actual junction temperature of the common-emitter and common-base InGaP/GaAs HBT having the heat-dissipating copper pillar structure provided by the present disclosure only rises from 35° C. to 53° C.

FIG. 6 is the changes of the radio frequency output powers ($P_{OUT}$) and the power added efficiencies (PAE) of the common-emitter and common-base heterojunction bipolar transistor of an embodiment provided by the present disclosure and the heterojunction bipolar transistor of the conventional structure over the radio frequency input power ($P_{IN}$). The common-emitter and common-base InGaP/GaAs HBT having the heat-dissipating copper pillar structure provided by the present disclosure has a saturated output power of 33 dBm, a peak power-added efficiency (PAE) of more than 66%, and a saturated output characteristic superior to the InGaP/GaAs HBT of the traditional structure. More importantly, when the RF input power ($P_{IN}$) falls back to 0 dBm, the power added efficiency (PAE) of the common-emitter and common-base InGaP/GaAs HBT having the heat-dissipating copper pillar structure provided by the present disclosure is still greater than 60%, while the power added efficiency (PAE) of the InGaP/GaAs HBT of the traditional structure has been less than 30%, which indicates that the Miller capacitance feedback effect of the common-emitter and common-base InGaP/GaAs HBT having the heat-dissipating copper pillar structure provided by the present disclosure is very low. Therefore, the common-emitter and common-base heterojunction bipolar transistor provided by the present disclosure has excellent power gain and power added efficiency over a very wide range of RF input power, which have very important application prospects in 4G LTE adopting an envelope tracking (ET) architecture and multi-mode multi-frequency RF power amplifier applications of future 5G communication terminals.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

What is claimed is:

1. A common-emitter and common-base heterojunction bipolar transistor, being disposed on a packaging substrate, the packaging substrate being provided with a heat sink, wherein the common-emitter and common-base heterojunction bipolar transistor comprises at least one common-emitter and common-base heterojunction bipolar transistor unit, and the common-emitter and common-base heterojunction bipolar transistor unit comprises a common-base heterojunction bipolar transistor and a common-emitter heterojunction bipolar transistor; the common-base heterojunction bipolar transistor comprises a first base, a first emitter and a first collector; the common-emitter heterojunction bipolar transistor comprises a second base, a second emitter and a second collector; the common-emitter and common-base heterojunction bipolar transistor unit comprising:
   a heat shunt bridge for connecting the first emitter and the second collector, the heat shunt bridge being made of one or more of copper, gold, and aluminum by electroplating and having a thickness of 0.5-20 microns;
   a first pad for being connected with the first base;
   a first copper pillar disposed over the first pad;
   a second pad for being connected with the first collector;
   a second copper pillar disposed over the second pad;
   a third pad for being connected with the second base;
   a third copper pillar disposed over the third pad; and
   a fourth copper pillar disposed above the second emitter;
   wherein the common-emitter and common-base heterojunction bipolar transistor unit is flip-chip mounted on the packaging substrate, and the fourth copper pillar is soldered on the heat sink.

2. The common-emitter and common-base heterojunction bipolar transistor according to claim 1, wherein the common-emitter and common-base heterojunction bipolar transistor unit further comprises copper-gold-tin alloy solders disposed on the top of the first copper pillar, the second copper pillar, the third copper pillar, and the fourth copper pillar, respectively.

3. The common-emitter and common-base heterojunction bipolar transistor according to claim 1, wherein the first copper pillar, the second copper pillar, the third copper pillar, and the fourth copper pillar are distributed in equal height, and the heat sink comprises a first heat sink layer, a second heat sink layer, a third heat sink layer, and a fourth sink layer spaced apart from one another, and when the common-emitter and common-base heterojunction bipolar transistor unit is flip-chip mounted on the packaging substrate, the first copper pillar, the second copper pillar, the third copper pillar and the fourth copper pillar are soldered one-to-one correspondingly on the first heat sink layer, the second heat sink layer, the third heat sink layer, and the fourth sink layer.

4. The common-emitter and common-base heterojunction bipolar transistor according to claim 1, wherein the common-emitter and common-base heterojunction bipolar transistor comprises two or more common-emitter and common-base heterojunction bipolar transistor units, the two or more common-emitter and common-base heterojunction bipolar transistor units are connected in parallel.

5. The common-emitter and common-base heterojunction bipolar transistor according to claim 1, wherein in the common-emitter and common-base heterojunction bipolar transistor unit, a material system comprises InGaP/GaAs, InGaP/GaAsSb, InGaP/InGaAsSb, InP/InGaAs, InP/GaAsSb or InP/InGaAsSb.

* * * * *